United States Patent [19]

Creuzet et al.

[11] Patent Number: 4,983,570
[45] Date of Patent: Jan. 8, 1991

[54] METHOD FOR FORMING A THIN LAYER OF SUPERCONDUCTING MATERIAL ON A SUBSTRATE AND ARTICLE PRODUCED THEREBY

[75] Inventors: Gérard Creuzet; Alain Friederich, both of Paris, France

[73] Assignee: Thomson-CSF, Paris, France

[21] Appl. No.: 214,047

[22] Filed: Jun. 30, 1988

[30] Foreign Application Priority Data

Jul. 3, 1987 [FR] France .................. 87 09462

[51] Int. Cl.$^5$ .................. B05D 5/12; C23C 16/00
[52] U.S. Cl. .................. 505/001; 156/600; 156/610; 427/62; 505/729; 505/732
[58] Field of Search .................. 156/600, 610; 505/14, 505/729.732; 427/62

[56] References Cited

U.S. PATENT DOCUMENTS 4,916,114 4/1990 Hoenig .................. 505/742

FOREIGN PATENT DOCUMENTS 0028875 1/1989 Japan .................. 420/930

OTHER PUBLICATIONS

Physical Review B, vol. 35, No. 16, Ler Juin 1987, pp. 8821–8823, The American Physical Society, New York, U.S.; R. B. Laibowitz et al.: "Thin Superconducting Oxide Films".

Japanese Journal of Applied Physics, Supplements 6th International Meeting On Ferroelectricity, Kobe, 12–16 About 1985, vol. 24, No. 2, pp. 323–325, Tokyo, JP; T. Murakami et al.: "Single-Crystal Thin-Film-Growth and Properties of BaPbl-xBixO3".

Le Vide, Les Couches Minces, vol. 41, No. 231, mars-avril 1986, pp. 239–240, Paris, FR: A. Leycuras et al: "Super reseau a contraintes Gel-xSix/Gel-ySiy pour la croissance en adaption de maille de GaAs sur substrats de silicium".

Proceedings of Symposium S, 1987 Spring Meeting of the Material Research Society, Anaheim, California, 23–24 avril 1987, pp. 169–171; R. H. Hammond et al.:'-'Superconducting Thin Films of the Perovskite Superconductors by Electron-Beam Deposition".

Kwo et al. in Novel Superconductivity ed. Wolf et al., Jun. '87, Plenum, p. 699.

Siegrist et al. Phys. Rev. 35B (May 1, 1987) 7137.

Adachi et al. Phys. Rev. 35B (Jun. 1, 1987) 8824.

Mankiewich et al. in MRS Symp. Proc. #99, Nov. 30, 1987, ed. Brodsky, p. 119.

Naito et al. Phys. Rev. B 35 (1 May 1987) 7228.

Moriwaki et al.; High $T_c$ Superconductors ed. Gubser et al., Apr. 1987, p. 85.

Laibowitz et al. Phys. Rev. B, 35 (1 Jun. 1987), 8821.

Suzuki et al. Jap. Jour. Appl. Phys. 26 (Apr. 1987) L-52Y.

Bao et al. in Proc. Beijing ($^N$nt. Workshop High $T_c$-Superconductivity (Ed. Gan et al.) Jun. '87, World Press, p. 369.

Yee et al. in AIP Conf. Proc. #165 ed. Lucovsky No. 6, 1987, p. 133.

Primary Examiner—Upendra Roy
Attorney, Agent, or Firm—Oblon, Spivak, McClelland, Maier & Neustadt

[57] ABSTRACT

The invention provides a method of forming thin layers of superconducting materials and a superconducting device. In accordance with the invention, such layers are formed by the epitaxial growth, on a substrate, of the different constituent elements by regulating the admission of the different constituents so as to obtain a superconducting layer whose mesh parameter substantially matches that of the substrate. Epitaxying may also be carried out directly from a superconducting material.

11 Claims, 1 Drawing Sheet

FIG_1
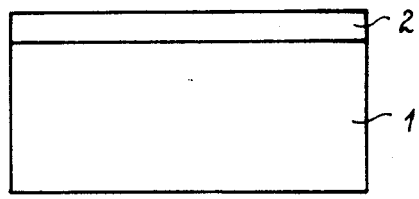
FIG_2
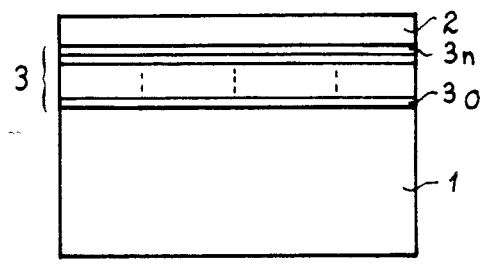
FIG_3
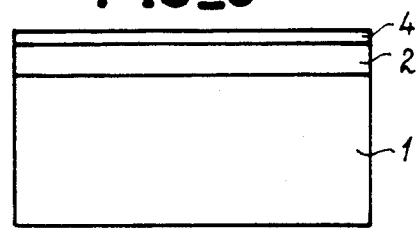
FIG_4
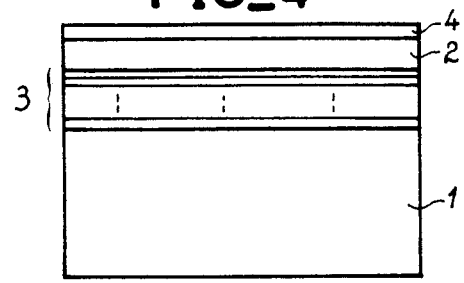

METHOD FOR FORMING A THIN LAYER OF SUPERCONDUCTING MATERIAL ON A SUBSTRATE AND ARTICLE PRODUCED THEREBY

BACKGROUND OF THE INVENTION

The invention relates to a method of forming thin layer devices from superconducting materials on a substrate. It relates to thin layer superconducting devices.

The invention relates more particularly to a method of preparing thin layers of oxides which are superconducting at a high critical temperature. The superconducting properties of these compounds being intimately dependent on the crystalline structure, this is obtained directly during epitaxial growth on an appropriate substrate.

Superconducting oxides are revolutionizing the field of superconductivity and its applications. The first reference thereto was made by J. G. Bednorz and K. Muller in the document Z. Phys. B 64, 1986, pages 189 to 193 relating to a barium doped compound LA-Cu-O in which the beginning of superconducting transition is observed at about 35K. Doping with strontium raises this temperature slightly and makes this superconductivity more massive. Finally, the substitution of yttrium tor lanthanum gives rise to a critical temperature of 93° kelvin, as was reported by M. K. Wu et al in the document Physical. Review. Letters 58, 1987, pages 908 to 910.

The existence of materials which are superconducting at temperatures higher than that of liquid nitrogen (77K) makes it possible to do away with the need for working in liquid helium, a requirement which greatly limited up to now the development of superconductivity applications. Among these latter, a large proportion (junction devices, IR absorbents, memories, . . . ) must be formed from thin layers. The preparation of the superconducting material in this form is thus essential.

All of the known superconducting oxides have a narrow correlation between the superconducting properties and the crystallographic structure. This is always true for the perovskite type. In the $La_{2-x}Ba_xCuO_{4-y}$ and $La_{2-x}Sr_xCuO_{4-y}$ systems, the structure is of $K_2NiF_4$ type, as described for example by N. Nguyen, F. Studer and B. Raveau in the document Journal. Physical. Chemical. Solids, 44, 1983, pages 389 to 400. In the $YBa_2Cu_3O_{7-y}$ system, the structure is slightly different but still of perovskite type, as is reported for example by T. Siegrist et al, Physic Review B 35, 1987, pages 7137 to 7139.

Apart from the structure, the other fundamental parameters for obtaining superconducting properties in these systems is the oxygen content, as described for example in the article by R. J. Cava et Coll, phys. Rev. Lett, 58, 1987, pages 408 to 410.

The whole of the results reporled up to now relate to materials prepared in the form of sintered powders, which may be described as a juxtaposition of small crystalline grains. The appropriate oxygen proportion is obtained by annealing in an oxygen atmosphere. The invention relates to the preparation of these materials in the form of thin layers epitaxied on substrates chosen so that the structure corresponding to the superconducting properties will be obtained.

SUMMARY OF THE INVENTION

The invention relates to a method of forming thin layers of superconducting materials on a substrate, including a step for epitaxial growth from molecular flows whose sources are either the raw elements (La, Ba, Cu or Y, Ba, Cu for example), or oxides of these elements, with flows such that a desired stoichiometry layer is obtained corresponding to the solid material having superconductivity at a high critical temperature. This first method relates to direct epitaxial growth of a monocrystalline layer.

The invention also relates to a method of forming layers of superconducting materials on a substrate comprising the following successive steps :
- a step of forming a solid superconducting material having a lattice parameter corresponding to a multiple or a sub-multiple of the lattice parameter of the substrate ;
- a step for the solid phase epitaxial growth of the material obtained during the preceding step on the substrate.

Finally, the invention also provides a device made from thin layers of superconduoting materials formed using a preceding method, having on a substrate at least one layer of a superconducting material with a lattice parameter corresponding to a multiple or a sub-multiple of the lattice parameter of the substrate.

BRIEF DESCRIPTION OF THE DRAWINGS

The different objects and features of the invention will be clearly understood from the following description given by way of example with reference to the accompanying figures which show :

FIG. 1, one embodiment of a thin layer superconducting material device of the invention ;

FIG. 2, an embodiment of a thin layer superconducting device having a super-network for matching ;

FIG. 3, embodiments of thin layer superconducting devices having sealed protective layers.

DETAILED DESCRIPTION OF THE INVENTION

In the method of the invention, a layer 2 is grown by epitaxy of a material likely to become superconducting after oxidation on a substrate 1, such as shown in FIG. 1. The equipment for carrying out the epitaxy is conventional epitaxy equipment known in the technique. So as to obtain the appropriate dosing of the constituent substances, in a first stage the admission of each substance is regulated separately and then all the substances are epitaxied simultaneously.

In addition, so that there is epitaxial growth, the substrate is chosen as a function of the final desired compound so that there is lattice matching, i.e. the mesh parameter of the layer obtained is equal to a multiple or a sub-multiple of the lattice parameter ol lhe substrate.

Oxidation of the layer obtained takes place in an oxygen atmosphere at an annealing temperature of about 900° C., for example, depending on the nature of the thin layer. The duration of this oxidation (from a few hours to several days) is determined so as to obtain a composltion of the layer such that it has superconductivity at high temperature.

In a variant of the method of the invention, the epitaxy is carried out in the presence of a local oxygen flow. The oxygen flow remains low (pressure of $10^{-4}$ to $10^{-3}$ torr tor example) so as to remain compatible with the technical requirements of a molecular jet epitaxy structure. This epitaxy may also be completed by annealing in an oxygen atmosphere to make oxidation of the layer more precise.

The oxygen supply may also be provided by annealing in an oxygen plasma so as to improve the diffusion through the material.

In another variant of the method of the invention, the thin layer Z may be formed from a solid material having the desired superconducting effect and this solid material may be deposited on substrate 1 in an amorphous or partially crystalline state, using any deposition technique : cathode spraying, molecular jets, or simply evaporation, for example.

Within the scope of this variant, the method of the invention therefore provides first of all a step for forming a material having a stoichiometry identical to that of the material which has the desired superconducting effect and further having a lattice parameter substantially equal to a multiple or a sub-multiple of the lattice parameter of the substrate on which the material is deposited.

This step of forming the superconducting material is followed by a step for the solid phase epitaxy of the material obtained on substrate 1. During this phase, by means of appropriate thermal annealing, the material of layer 2 passes gradually from a disordered structure to a monocrystalline structure. This solid phase transformation takes place from substrate which therefore imposes the structure and the lattice parameter. This type of solid phase epitaxy is of the type used for example for forming amorphous silicon layers.

To facilitate the lattice matching of the thin layer 2 of superconducting material and of substrate 1, the method of the invention also provides, before carrying out epitaxy of layer 2 on the substrate, a step of forming a lattice matching super-lattice. This super-lattice 3 is also formed by epitaxy. Its purpose is to provide a succession of layers the closest of which to substrate 1 have a lattice parameter adapted to that of substrate 1 and the furthest away (so those which will be the closest to the thin layer 2) will have a lattice parameter adapted to that of the thin layer 2. This step of the method makes it possible to provide on substrate 1 matching of a thin layer 2 whose lattice parameter does not naturally match up with that of substrate.

Finally, the method of the invention provides, after formation of the thin superconducting layer 2 and after a possible oxidation step, a step for encapsulating the thin superconducting layer 2.

The purpose of this encapsulation step is to deposit on the thin superconducting material layer 2, a layer of an oxygen impermeable material. This encapsulation step takes place after the desired oxygen stoichiometry of the thin layer 2 has been obtained so as to avoid any subsequent degradation.

This encapsulation makes it possible, if required, to carry out an annealing step for crystallizing the thin layer 2, without loss of oxygen. Thus, in the case of incomplete epitaxy, in a subsequent step, solid phase epitaxy may be carried out on the encapsulated layer by means of an appropriate heat treatment.

In FIG. 1, we thus have a substrate 1 with a thin layer 2 of a superconducting material having a lattice parameter substantially equal to a multiple or a sub-multiple of that of substrate 1.

In FIG. 2, the substrate 1 has a super-lattice 3 on which the thin layer 2 of superconducting material 2 is formed. The purpose of this super-lattice 3 is to match the lattice parameter of thin layer 2 to that of substrate 1. The layers which are the closest to the substrate, such as 30, have a lattice parameter substantially equal to a multiple or a sub-multiple of the lattice parameter of substrate 1. The layers the closest to the thin layer 2, such as layer 3n, have a lattice parameter substantially equal to a multiple or a submultiple of the lattice parameter of layer 2. The purpose of the intermediate layers of the super-lattice is to gradually match the lattice parameters which is required by the lattice parameter differences.

FIG. 3 shows a device comprising on a substrate 1, a thin layer 2 of a superconducting material, the whole being covered with a layer 4 of an oxygen impermeable material. This layer 4 prevents any variation of the oxygen stoichiometry of thin layer 2.

Finally, FIG. 4 shows the device of FIG. 2 including a super-lattice 3, the whole being covered as in FIG. 3 by an oxygen tight material layer.

It is obvious that the above description has only been given by way of example. Other variants may be envisaged without departing from the scope of the invention. The numerical values as well as the examples of materials used and the manufacturing methods indicated have only been given to illustrate the description.

What is claimed is:

1. A method for forming a thin film layer of superconducting materials on a substrate, comprising epitaxially growing metal oxides and rare earth oxides or raw unoxidized elements on a substrate such that a layer is obtained whose material has a lattic parameter corresponding substantially to a multiple or a sub-multiple of the lattice parameter of the substrate, oxidizing the epitaxially grown layer and covering the oxidized epitaxially grown layer with an oxygen impermeable material, said layer having superconductivity at a high critical temperature.

2. The method for forming a thin film layer of superconducting materials on a substrate as claimed in claim 1, comprising:
providing a solid superconducting material in the amorphous or partially crystalline state; and
solid phase epitaxially growing said solid material on said substrate.

3. The method as claimed in claim 1, wherein the epitaxial growth is carried out in an oxygen flow.

4. The method as claimed in claim 1, wherein the epitaxial growth is followed by an annealing step in an oxygen atmosphere.

5. The method as claimed in claim 1, wherein the epitaxial growth is followed by an annealing step in oxygen plasma.

6. The method as claimed in claim 1, wherein the epitaxial growth step is preceded by a step for forming on the substrate a lattice matching super-lattice.

7. A method for forming a thin film layer of superconducting material on a substrate, comprising epitaxially growing metal oxides and rare earth oxides or raw unoxidized elements on a substrate, oxidizing the epitaxially grown layer, and depositing an oxygen impermeable material on the oxidized layer.

8. The method for forming a thin film layer of superconducting materials on a substrate as claimed in claim 7, comprising:
providing a solid superconducting material in the amorphous or partially crystalline state; and solid phase epitaxially growing said solid material on said substrate.

9. The method of claim 7, wherein the epitaxial growth is carried out in an oxygen flow.

10. The method of claim 7, wherein the epitaxial growth is followed by an annealing step in an oxygen atmosphere.

11. The method of claim 7, wherein the epitaxial growth epitaxial growth is followed by an annealing step in oxygen plasma.

* * * * *